US012597478B2

(12) United States Patent (10) Patent No.: US 12,597,478 B2
Kokusho (45) Date of Patent: Apr. 7, 2026

(54) MEMORY DEVICE

(71) Applicant: Rohm Co., Ltd., Kyoto (JP)

(72) Inventor: Yuichi Kokusho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 129 days.

(21) Appl. No.: 18/393,544

(22) Filed: Dec. 21, 2023

(65) Prior Publication Data

US 2024/0170081 A1 May 23, 2024

Related U.S. Application Data

(63) Continuation of application No. PCT/JP2022/023279, filed on Jun. 9, 2022.

(30) Foreign Application Priority Data

Jun. 25, 2021 (JP) .................................. 2021-105547

(51) Int. Cl.
*G11C 29/04* (2006.01)
(52) U.S. Cl.
CPC .................................... *G11C 29/04* (2013.01)
(58) Field of Classification Search
CPC ........ G11C 29/04; G11C 29/027; G11C 17/12
See application file for complete search history.

(56) References Cited

U.S. PATENT DOCUMENTS

2006/0209583 A1* 9/2006 Kawabata .............. G11C 15/00
365/49.1
2006/0256637 A1* 11/2006 Takahashi .............. G11C 29/44
365/222

2013/0028002 A1 1/2013 Liu
2017/0040067 A1* 2/2017 Byun ..................... G11C 17/16

FOREIGN PATENT DOCUMENTS

JP S60-020400 2/1985
JP H03-097200 4/1991
JP 2020-154584 9/2020

OTHER PUBLICATIONS

International Search Report and Written Opinion in International Appln. No. PCT/JP2022/023279, mailed on Aug. 2, 2022, 15 pages (with machine translation).
JP OA—Japanese Patent Office, Office Action in Japanese Appln. No. 2023-529832, dated Dec. 2, 2025, 9 pages (with English Translation).
JP OA—Japanese Patent Office, Office Action in Japanese Appln. No. 2023-529832, dated Feb. 24, 2026, 6 pages (with English translation).

* cited by examiner

*Primary Examiner* — Mohammed A Bashar
(74) *Attorney, Agent, or Firm* — Fish & Richardson P.C.

(57) ABSTRACT

A memory device includes: a word line selector (X decoder) configured to select word lines; a memory cell having cells that are connected to the word lines and to bit line units so as to be arrayed in a matrix; a bit detector configured to detect, via the bit line units, the logic values of the bit data stored in the cells connected to a selected word line; a data output circuit configured to output data based on the results of detection by the bit detector; and a controller. Fixed values are stored in part of the cells corresponding to a predetermined number of bits, and the controller compares, with expected values, the fixed values read from the part of the cells via the bit detector and the data output circuit.

9 Claims, 5 Drawing Sheets

Fig.4

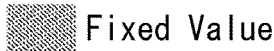 Fixed Value

| Area | | | Normal Area | | ROM |
|---|---|---|---|---|---|
| | TXADD | XADD | [31:0] | | [7:0] |
| Fixed Area | 1 | 0x1F | 0x89AB | 0xCDEF | 0xE0 |
| | | 0x1E | 0x7654 | 0x3210 | 0xE1 |
| Standard Area | 0 | 0xBF | 0xXXXX | 0xXXXX | 0x00 |
| | | 0xBE | 0xXXXX | 0xXXXX | 0x01 |
| | | * | 0xXXXX | 0xXXXX | * |
| | | * | 0xXXXX | 0xXXXX | * |
| | | * | 0xXXXX | 0xXXXX | * |
| | | 0xA1 | 0xXXXX | 0xXXXX | 0x1E |
| | | 0xA0 | 0xXXXX | 0xXXXX | 0x1F |
| Standard Area | 0 | 0x3F | 0xXXXX | 0xXXXX | 0x00 |
| | | 0x3E | 0xXXXX | 0xXXXX | 0x01 |
| | | * | 0xXXXX | 0xXXXX | * |
| | | * | 0xXXXX | 0xXXXX | * |
| | | * | 0xXXXX | 0xXXXX | * |
| | | 0x21 | 0xXXXX | 0xXXXX | 0x1E |
| | | 0x20 | 0xXXXX | 0xXXXX | 0x1F |
| Standard Area | 0 | 0x00 | 0xXXXX | 0xXXXX | 0x00 |
| | | 0x01 | 0xXXXX | 0xXXXX | 0x01 |
| | | * | 0xXXXX | 0xXXXX | * |
| | | * | 0xXXXX | 0xXXXX | * |
| | | * | 0xXXXX | 0xXXXX | * |
| | | 0x1E | 0xXXXX | 0xXXXX | 0x1E |
| | | 0x1F | 0xXXXX | 0xXXXX | 0x1F |
| Fixed Area | 1 | 0x01 | 0x5555 | 0x5555 | 0xFE |
| | | 0x00 | 0xAAAA | 0xAAAA | 0xFF |

MEMORY DEVICE

CROSS-REFERENCE TO RELATED APPLICATIONS

This nonprovisional application is a continuation application of International Patent Application No. PCT/JP2022/023279 filed on Jun. 9, 2022, which claims priority Japanese Patent Application No. 2021-105547 filed on Jun. 25, 2021, the entire contents of which are hereby incorporated by reference.

TECHNICAL FIELD

The invention disclosed herein relates to memory devices.

BACKGROUND ART

Today, many kinds of memory devices such as OTP (one-time-programmable) ROMs are in practical use (for one example of OTP ROMs, see Patent Document 1).

CITATION LIST

Patent Literature

Patent Document 1: JP-A-2020-154584

BRIEF DESCRIPTION OF DRAWINGS

FIG. 4 is a diagram showing an example of the data structure of a memory cell.

DESCRIPTION OF EMBODIMENTS

Illustrative embodiments of the present disclosure will be described below with reference to the accompanying drawings.

1. TARGET OF APPLICATION OF A MEMORY DEVICE

Figure 1:
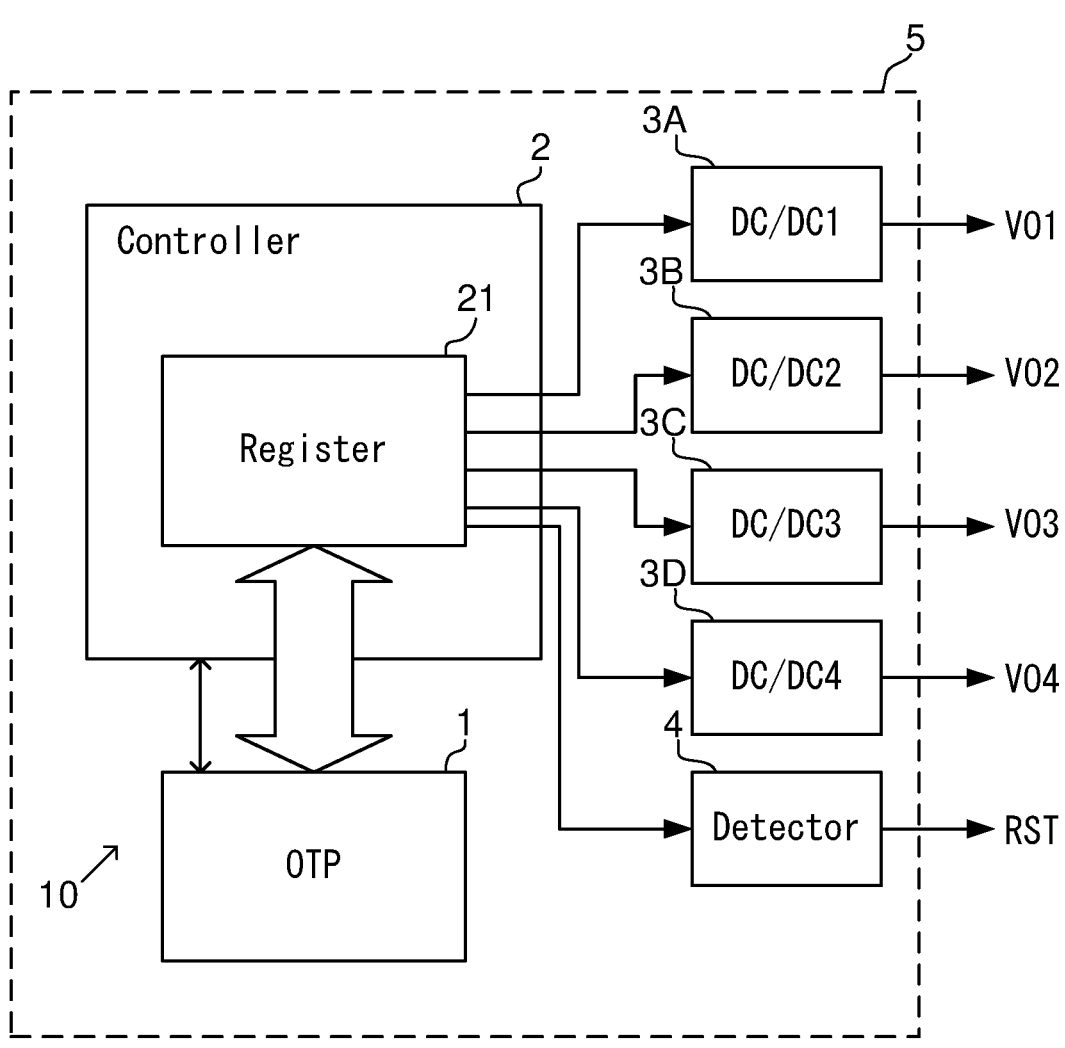
FIG. 1 is a diagram showing the configuration of a power supply device according to an illustrative embodiment of the present disclosure.

FIG. 1 shows the configuration of a power supply device 5 as one example of a target of application of (an application in which to employ) a memory device according to an illustrative embodiment of the present disclosure. The power supply device 5 includes a memory device 10.

The power supply device 5 is a semiconductor device (IC package) that has integrated in a single chip an OTP block 1, a controller 2, DC/DC converter circuits 3A to 3D, and a detector 4. The power supply device 5 can generate a plurality of output voltages V01 to V04, and is incorporated in, for example, a vehicle.

The OTP block 1 is composed of a memory cell and peripheral circuits around it (of which none are illustrated). The memory cell stores various kinds of setting information and the like. The configuration of the OTP block 1 will be described in detail later.

The controller 2 is a device that controls different parts of the power supply device 5. The controller 2 controls, for example, the OTP block 1. The OTP block 1 and the controller 2 constitute the memory device 10. That is, the power supply device 5 includes a memory device 10.

The controller 2 includes a register 21. In response to an instruction from the controller 2, data is read from the OTP block 1 (memory cell) and is stored in the register 21.

The DC/DC converter circuits 3A to 3D perform DC/DC conversion on an input voltage to produce and output the output voltages V01 to V04. The set values for the output voltages V01 to V04 are set according to the data stored in the register 21

The detector 4 detects an overvoltage or undervoltage in the output voltages V01 to V04 to output a detection signal RST. The threshold values for the detection by the detector 4 are set according to the data stored in the register 21.

2. CONFIGURATION OF A MEMORY DEVICE

Figure 2:
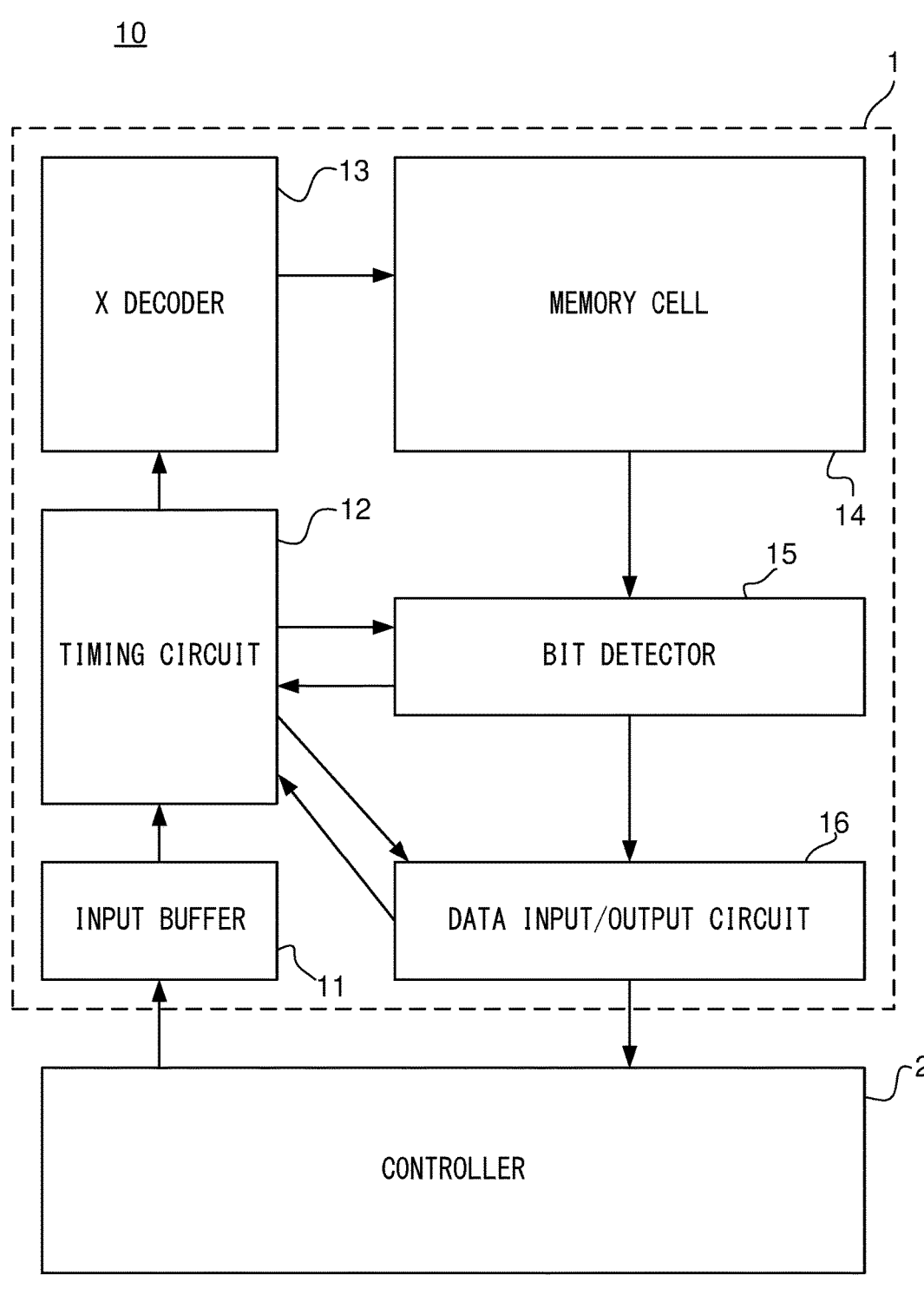
FIG. 2 is a block diagram showing a configuration example of a memory device.

Next, the configuration of the memory device 10 will be described more specifically. FIG. 2 is a block diagram showing a configuration example of the OTP block 1.

As shown in FIG. 2, the OTP block 1 includes an input buffer 11, a timing circuit 12, an X decoder 13, a memory cell 14, a bit detector 15, and a data input/output circuit 16.

The input buffer 11 stores address specification information fed from the controller 2. The timing circuit 12 controls the timing among the X decoder 13, the bit detector 15, and the data input/output circuit 16.

Based on the address specification information fed from the input buffer 11 via the timing circuit 12 to it, the X decoder 13 selects a word line (row) in the memory cell 14.

The memory cell 14 is composed of a plurality of cells arrayed in a matrix. Each cell is configured with a transistor.

The bit detector 15 detects the logic value (0 or 1) of the bit data stored at each cell on the word line selected by the X decoder 13 in the memory cell 14. Based on the result of the detection by the bit detector 15, the data input/output circuit 16 outputs the data at each cell on the selected word line to the controller 2. That is, by the bit detector 15 and the data input/output circuit 16, the data on the word line selected as described above is read from the memory cell 14.

Figure 3:
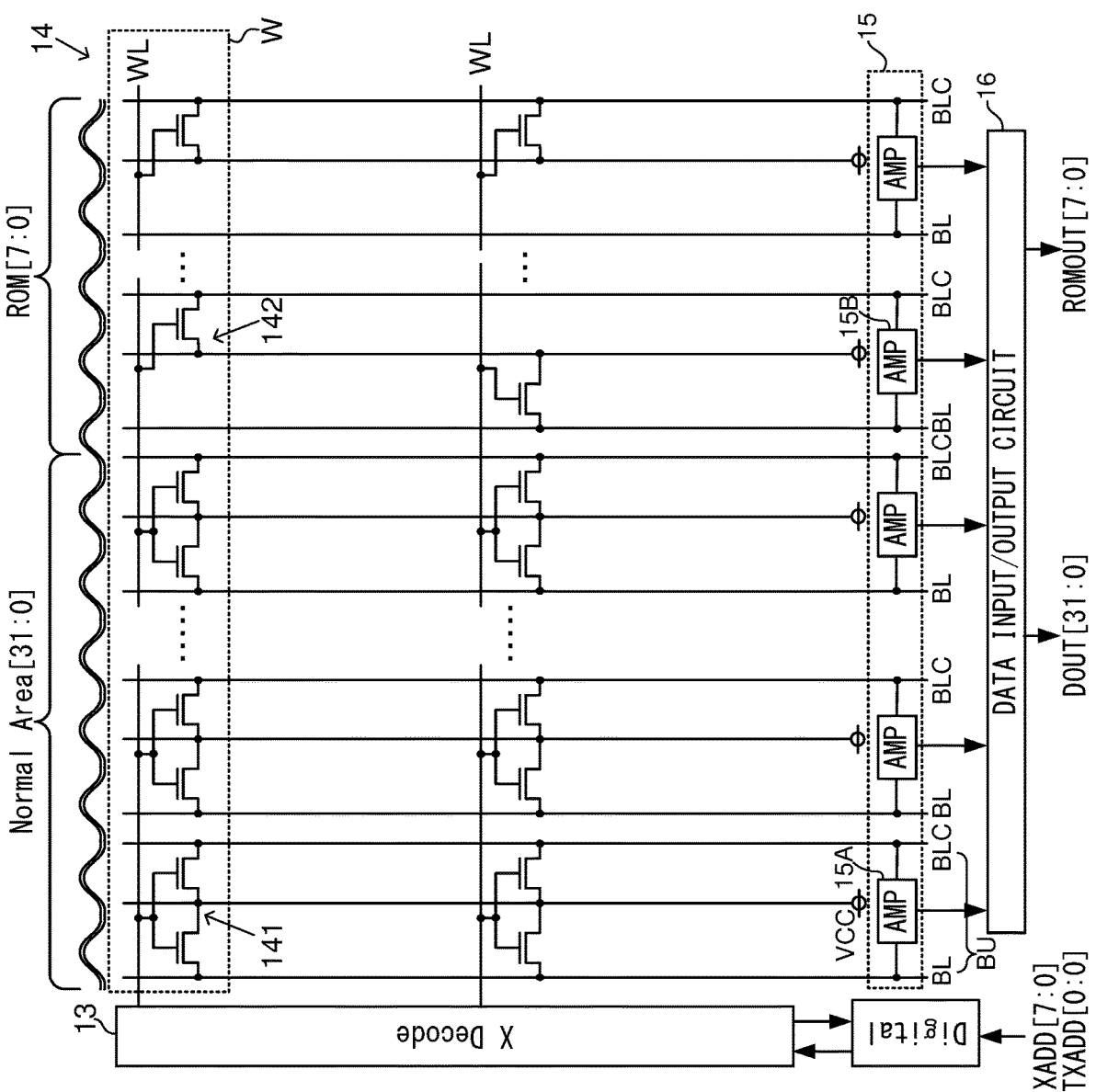
FIG. 3 is a diagram showing a specific configuration example of a memory cell.

FIG. 3 is a diagram showing a specific configuration example of the memory cell 14. Note that FIG. 3 only shows part of the cells in the memory cell 14.

As shown in FIG. 3, the memory cell 14 has a normal area and a ROM area. In the normal area, OTP cells 141 are arrayed in a matrix; in the ROM area, ROM cells 142 are arrayed in a matrix.

Each OTP cell 141 is composed of two MOS transistors. The gates of the two MOS transistors are both connected to a word line WL. The first terminals of the two MOS transistors are connected together. The second terminal of one MOS transistor is connected to a bit line BL. The second terminal of the other MOS transistor is connected to a bit line BLC.

A total of 32 OTP cells 141, each configured as described above, are provided on each word line WL. Thus, in the normal area, 32-bit data can be stored per word line WL.

In the normal area, 32 bit line unit BU, each composed of a bit line BL and a bit line BLC, are provided. Between the bit lines BL and BLC in each bit line unit BU, a sense amplifier 15A is inserted. That is, in the normal area, 32 sense amplifiers 15A are provided. The sense amplifiers 15A constitute the bit detector 15.

The nodes at which the first terminals of the MOS transistors in the respective OTP cells 141 connected between the bit lines BL and BLC in each bit line unit BU are connected together can be collectively fed with a voltage from a voltage feeder VCC.

In an OTP cell 141, one of the two MOS transistors has electric charge injected into its gate. Depending on which of the MOS transistors has electric charge injected into it, the value of the bit data stored in the OTP cell 141 differs (0 or 1). With electric charge injected into one of them, the two MOS transistors in the OTP cell 141 have different threshold voltages.

The X decoder 13 applies a predetermined voltage to a word line WL to select it. To the OTP cells 141 on the selected word line WL, a voltage is applied from the voltage feeder VCC. In this state, the difference between the threshold voltages of the MOS transistors in each OTP cell 141 on the selected word line WL causes those MOS transistors to be on to different degrees. This produces a difference between the currents that pass through the MOS transistors. The sense amplifier 15A amplifies the difference between the currents and outputs the result. In this way, the sense amplifier 15A detects the logic value of the bit data stored in the OTP cells 141 on the selected word line WL.

The bit data of the 32 OTP cells 141 on the selected word line WL in the normal area is thus detected by 32 sense amplifiers 15A respectively. Based on the results of the detection by those sense amplifiers 15A, the data input/output circuit 16 outputs 32-bit normal area data DOUT.

Each ROM cell 142 is composed of one MOS transistor. The gate of the one MOS transistor is connected to a word line WL. The first terminal of the one MOS transistor is connected to an application terminal for the voltage from the voltage feeder VCC. The second terminal of the one MOS transistor is connected to either a bit line BL or a bit line BLC.

A total of eight ROM cells 142, each configured as described above, are provided on each word line WL. Thus, in the ROM area, 8-bit data can be stored per word line WL. Note that a word line WL is common to the normal area and the ROM area. That is, on one word line WL (in a one-word region W in FIG. 3), 32 OTP cells 141 and 8 ROM cell 142 are provided.

In the ROM area, eight bit line units BU, each composed of a bit line BL and a bit line BLC, are provided. Between the bit lines BL and BLC in each bit line unit BU, a sense amplifier 15B is inserted. That is, in the ROM area, eight sense amplifiers 15B are provided. The sense amplifiers 15B, together with the sense amplifiers 15A, constitute the bit detector 15.

The first terminals of all the ROM cells 142 connected between the bit lines BL and BLC in each bit line unit BU can be collectively fed with a voltage from the voltage feeder VCC.

The X decoder 13 applies a predetermined voltage to a word line WL to select it. The ROM cells 142 on the selected word line WL are fed with a voltage from the voltage feeder VCC. In this state, depending on which of the bit lines BL and BLC the MOS transistors in the ROM cells 142 on the selected word line WL are connected, a difference arises between the currents that pass across the bit lines BL and BLC. The sense amplifier 15B amplifies the difference between the currents and outputs the result. In this way, the sense amplifier 15B detects the logic value of the bit data stored in the ROM cells 142 on the selected word line WL.

The bit data of the eight ROM cells 142 on the selected word line WL in the ROM area is thus detected by eight sense amplifiers 15B respectively. Based on the results of the detection by those sense amplifiers 15B, the data input/output circuit 16 outputs 8-bit ROM area data ROMOUT.

As described above, when the X decoder 13 selects a word line WL, from the cells on the selected word line WL in both the normal area and the ROM area, data (32 bits+8 bits) is read and output.

The bit data in the normal area may have any other number of bits than 32 bits. Likewise, the bit data in the ROM area may have any other number of bits than 8 bits While, in the example in FIG. 3, fixed values (described later) in the ROM area are held structurally as in the ROM cells 142, they may instead be held by injecting electric charge into transistors in cells similar to the OTP cells 141 shown in FIG. 3. Fixed values (described later) in the normal area may be held structurally as in the ROM cells 142 shown in FIG. 3.

3. DATA STRUCTURE IN THE MEMORY CELL

FIG. 4 is a diagram showing one example of the data structure in the memory cell 14. As shown in FIG. 4, the memory cell 14 has standard areas and fixed areas.

One standard area and one fixed area each correspond to one word line WL and includes a normal area and a ROM area. One standard area and one fixed area are each specified by a combination of first address information TXADD and second address information XADD. The first address information TXADD distinguishes between a standard area and a fixed area. In FIG. 3, TXADD=0 indicates a standard area and TXADD=1 indicates a fixed area. The second address information XADD identifies to which word line WL an area belongs among the areas specified by the first address information TXADD.

In FIG. 4, for example, the fixed area specified by TXADD=1 and XADD=0x1F has 0x89AB (16 bits) and 0xCDEF (16 bits) stored in the normal area and has 0xE0 (8 bits) stored in the ROM area.

Note that, as shown in FIG. 3, feeding the first address information TXADD and the second address information XADD from the controller 2 to the input buffer 11 (the block "Digital" in FIG. 3 corresponds to the input buffer 11 and the timing circuit 12 shown in FIG. 2) permits the X decoder 13 to select a word line WL.

In a fixed area, the normal area and the ROM area both store fixed values. Thus, fixed areas are areas dedicated to the storage of fixed values. These fixed values are data to be used in a self-diagnosis (BIST, built-in self-test) function, which will be described later, of the memory device 10. In FIG. 4, fixed values are indicated by hatching.

In a standard area, the normal area stores data that is read out when the above-mentioned self-diagnosis function gives an "OK" result. The data contains, among others, set values (such as the set value of the output voltage) for the ordinary operation of the power supply device 5. In a standard area, the ROM area stores a fixed value. These fixed values are data to be used in the self-diagnosis function mentioned above.

4. SELF-DIAGNOSIS FUNCTION

Next, a description will be given of the self-diagnosis function with which the memory device 10 is provided for enhanced functional safety.

When the power supply device 5 starts up, the memory device 10 performs self-diagnosis operation. In the self-diagnosis operation, the controller 2, by specifying addresses (word lines WL) with the address information TXADD and XADD mentioned above, read fixed values (indicated by hatching in FIG. 4) from the memory cell 14. The controller 2 compares the read fixed values with expected values.

If all the fixed values (over the entire hatched area) to be read match the expected values, the peripheral circuits around the memory cell 14 (i.e., the X decoder 13, the bit detector 15, and the data input/output circuit 16) are judged to be normal; thus an advance is made to the reading of data from the normal areas in the standard areas.

By contrast, if any read fixed value does not match the expected value, it is judged that there is a fault in the peripheral circuits around the memory cell 14; thus, the power supply device 5 ceases to start up. In this case, an indication of the fault may be delivered to outside the power supply device 5.

As shown in FIG. 4, for all the word lines WL, the ROM areas store fixed values to be used in the self-diagnosis function. That is, for all the word lines WL, the ROM cells 142 (8 bits each) that are respectively connected to them store fixed values. This makes it possible to check if the X decoder 13 is normal.

Moreover, as mentioned earlier, each ROM cell 142 (FIG. 3) is composed of one MOS transistor of which the second terminal is connected to either a bit line BL or a bit line BLC. This permits the sense amplifiers 15B to detect bits more accurately. It is thus possible to read the 8-it fixed values in the ROM areas more accurately.

Moreover, as shown in FIG. 4, in a fixed area, both the normal area and the ROM area store fixed values. For example, the fixed area (TXADD=1, XADD=0x1F) shown in FIG. 4 has fixed values of 0x89AB and 0xCDEF stored in the normal area and has a fixed value of 0xE0 stored in the ROM area. Thus, the bit line units BU to which the OTP cells 141 (16 bit each×2) and the ROM cells 142 (8 bits each) that store fixed values are connected constitute all the bit line units BU. This makes it possible to check whether the bit detector 15 (sense amplifiers 15A and 15B), the data input/output circuit 16, the timing circuit 12, and the input buffer 11 are normal.

Moreover, as shown in FIG. 4, the fixed values represented by the corresponding bits in the normal areas in two fixed areas have, as their bit data, logic values that are inverted with respect to each other (in FIG. 4, 0x89AB vs 0x7654, 0xCDEF vs 0x3210, and 0x5555 vs 0xAAAA). That is, the fixed values stored in the OTP cells 141 (16 bits each) that are connected to different word lines WL but to the same bit line unit BU have, as their bit data, logic values that are inverted with respect to each other. This permits the sense amplifiers 15A to detect both "0" and "1", and makes it possible to check if the sense amplifiers 15A are normal more accurately.

Moreover, as shown in FIG. 4, the fixed values in the ROM areas in a plurality of standard areas with consecutive addresses (XADD=0x00 to 0x1F) indicate those addresses (0x00 to 0x1F) themselves. That is, the fixed values stored in the ROM cells 142 (8 bits each) that are connected to different word line WL with consecutive addresses but to the same bit line unit BU indicate those consecutive addresses. This helps increase the variation of fixed values in ROM areas.

Moreover, as shown in FIG. 4, the addresses of fixed areas (XADD=0x00, 0x01, 0x1E, 0x1F) are identical with part of the consecutive addresses mentioned above, and the fixed values (0xFF, 0xFE, 0xE1, 0xE0) in the ROM areas in the fixed areas mentioned above are values resulting from inverting the logic values of bits with respect to the addresses of the fixed areas mentioned above. That is, the fixed values stored in the ROM cells 142 (8 bits each) that are assigned the same allocation addresses (0x00, 0x01, 0x1E, 0x1F) as at least part of the consecutive addresses mentioned above and that are connected to word lines WL different from the word line WL with the consecutive addresses mentioned above but to the same bit line unit BU are values resulting from inverting the logic values of the bits at the allocation addresses mentioned above. It is thus possible to increase the variation of fixed values in standard areas, and in ROM areas in fixed areas.

5. APPLICATION TO VEHICLES

Figure 5:
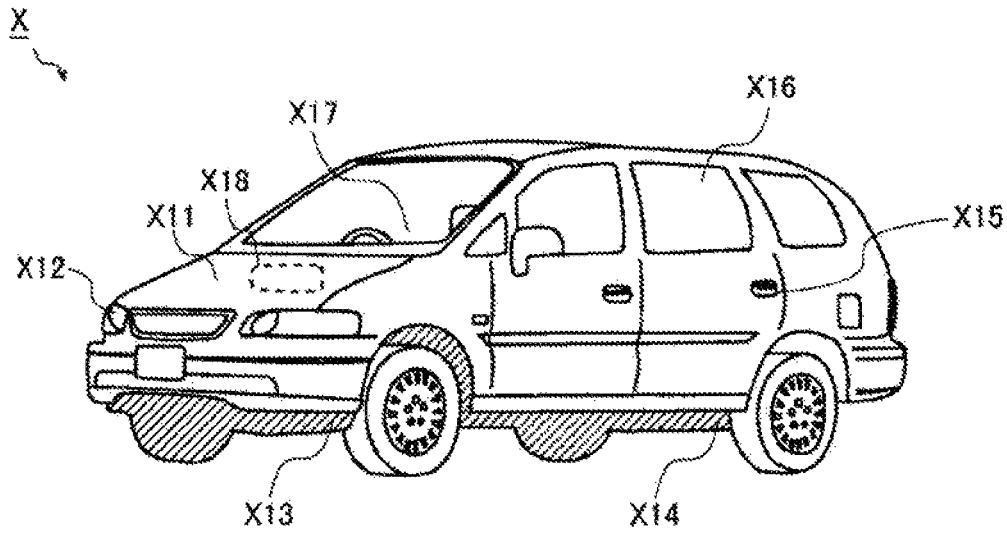
FIG. 5 is an exterior view showing a configuration example of a vehicle.

FIG. 5 is an exterior view showing one configuration example of a vehicle X. The vehicle X of this configuration example incorporates a battery (not shown in the diagram) and various electronic devices X11 to X18 that operate by being supplied with a supply voltage from the battery. For the sake of convenience, in the diagram, the electronic devices X11 to X18 may be shown at places different from where they are actually arranged.

The electronic device X11 is an engine control unit that performs control with respect to an engine (injection control, electronic throttle control, idling control, oxygen sensor heater control, automatic cruise control, etc.).

The electronic device X12 is a lamp control unit that controls the lighting and extinguishing of HIDs (high-intensity discharged lamps), DRLs (daytime running lamps), or the like.

The electronic device X13 is a transmission control unit that performs control with respect to a transmission.

The electronic device X14 is a body control unit that performs control with respect to the movement of the vehicle X (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The power supply device 5 described previously can be built into any of the electronic devices X11 to X18.

6. OVERVIEW

To follow is an overview of the various embodiments described above.

For example, according to one aspect of what is disclosed herein, a memory device (10) includes:

a word line selector (X decoder 13) configured to select word lines (WL);
    a memory cell (14) having cells (141, 142) that are connected to the word lines and to bit line units (BU) so as to be arrayed in a matrix;

a bit detector (15) configured to detect, via the bit line
  units, the logic values of the bit data stored in the cells
  connected to a selected word line;
a data output circuit (16) configured to output data based
  on the results of detection by the bit detector; and
a controller (2).
  Fixed values are stored in part of the cells corresponding
to a predetermined number of bits, and
  the controller compares, with expected values, the fixed
    values read from the part of the cells via the bit detector
    and the data output circuit. (A first configuration.)
  In the first configuration described above, the fixed values
may be stored in the part of the cells that are connected to
all the word lines respectively. (A second configuration.)
  In the first or second configuration described above, the
bit line units to which the part of the cells are connected may
constitute all the bit line units. (A third configuration.)
  In any of the first to third configurations described above,
the fixed values stored respectively in the part of the cells
that are connected to different word lines and to a same bit
line unit may have, as their bit data, logic values that are
inverted with respect to each other. (A fourth configuration.)
  In any of the first to fourth configurations described
above, the fixed values stored respectively in the part of the
cells that are connected to different word lines with con-
secutive addresses and to the same bit line unit may indicate
those consecutive addresses. (A fifth configuration.)
  In the fifth configuration described above, the fixed values
stored respectively in the part of the cells that are assigned
the same allocation addresses as at least part of the con-
secutive addresses and that are connected to word lines
different from the word lines with the consecutive addresses
and to the same bit line unit may be values resulting from
inverting logic values of bits at those allocation addresses.
(A sixth configuration.)
  In any of the first to sixth configurations described above,
each bit line unit may be composed of two bit lines (BL,
BLC), and
  the part of the cells may each be composed of a transistor
    connected to one of those two bit lines. (A seventh
    configuration.)
  The memory device of any of the configurations described
above may be, for example, for vehicle onboard use. (An
eighth configuration.)
  According to another aspect of what is disclosed herein,
a power supply device (5) includes: the memory device of
any of the configurations described above; and a power
supply circuit (3A to 3D).

7. MODIFICATIONS

The various technical features disclosed herein may be
implemented in any manners other than as in the embodi-
ments described above, and allow for many modifications
without departure from the spirit of their technical ingenuity.
That is, the embodiments described above should be under-
stood to be in every aspect illustrative and not restrictive,
and the technical scope of the present invention is defined
not by the description of the embodiments given above but
by the appended claims and encompasses any modifications
within a scope equivalent in significance to what is claimed.

INDUSTRIAL APPLICABILITY

The present disclosure finds applications in, for example,
power supply devices for vehicle onboard use.

REFERENCE SIGNS LIST

1 OTP block
2 controller
3A-3D DC/DC converter circuit
4 detector
5 power supply device
10 memory device
11 input buffer
12 timing circuit
13 X decoder
14 memory cell
15 bit detector
15A, 15B sense amplifier
16 data input/output circuit
21 register
141 OTP cell
142 ROM cell
BL, BLC bit line
BU bit line unit
VCC voltage feeder
W one-word region
WL word line
X vehicle
X11-X18 electronic device

The invention claimed is:
  1. A memory device, comprising:
  a word line selector configured to select word lines;
  a memory cell having cells that are connected to the word
    lines and to bit line units so as to be arrayed in a matrix;
  a bit detector configured to detect, via the bit line units,
    logic values of bit data stored in cells connected to a
    selected word line;
  a data output circuit configured to output data based on
    results of detection by the bit detector; and
  a controller,
  wherein
  the memory cell has a standard area and a fixed area, with
    a plurality of fixed values stored across the standard
    area and the fixed area,
  the standard area includes a first normal area and a first
    ROM area, with a first portion of the plurality of fixed
    values stored in the first ROM area,
  the fixed area includes a second normal area and a second
    ROM area, with a second portion of the plurality of
    fixed values stored in the second normal area and the
    second ROM area, wherein the fixed area is dedicated
    to fixed value storage,
  the controller is configured to compare each fixed value
    read from the standard area and the fixed area in the
    memory cell via the bit detector and the data output
    circuit, with a respective expected value, and
  determine that a peripheral circuit around the memory cell
    is normal, based on all fixed values from the standard
    area and the fixed area matching respective expected
    values, and
  read data out from the first normal area in the standard
    area.
  2. The memory device according to claim 1, wherein
  cells within the first ROM area and the second ROM area
    store a subset of the plurality of fixed values for all the
    word lines, respectively.
  3. The memory device according to claim 1, wherein
  the bit line units to which the cells included in the second
    normal area and the cells included in the second ROM
    area are connected constitute all the bit line units.

4. The memory device according to claim 1, wherein a first subset of the plurality of fixed values stored within a first region of the second normal area comprises bit values that are inverted with respect to bit values of a second subset of the plurality of fixed values stored within a second region of the second normal area.

5. The memory device according to claim 1, wherein a first subset of the plurality of fixed values in the first ROM area comprise consecutive addresses that indicate consecutive addresses of the first ROM area.

6. The memory device according to claim 5, wherein the fixed area is assigned same allocation addresses as at least part of the consecutive addresses, and a second subset of the plurality of fixed values in the second ROM area are values resulting from inverting logic values of bits at the allocation address.

7. The memory device according to claim 1, wherein each bit line unit is composed of two bit lines, and the cells are each composed of a transistor connected to one of those two bit lines.

8. The memory device according to claim 1, wherein the memory device is for vehicle onboard use.

9. A power supply device, comprising:

the memory device according to claim 1; and a power supply circuit.

* * * * *